United States Patent
Park

(10) Patent No.: US 8,830,764 B2
(45) Date of Patent: Sep. 9, 2014

(54) SEMICONDUCTOR MEMORY DEVICE AND DATA ERASE METHOD THEREOF

(75) Inventor: Young Soo Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 316 days.

(21) Appl. No.: 13/341,241

(22) Filed: Dec. 30, 2011

(65) Prior Publication Data

US 2012/0195130 A1 Aug. 2, 2012

(30) Foreign Application Priority Data

Jan. 31, 2011 (KR) ........................ 10-2011-0009809

(51) Int. Cl.
*G11C 11/34* (2006.01)

(52) U.S. Cl.
USPC ............ 365/185.29; 365/185.18; 365/185.22; 365/185.19; 365/185.24

(58) Field of Classification Search
USPC ............. 365/185.29, 185.18, 185.22, 185.19, 365/185.24
See application file for complete search history.

(56) References Cited

U.S. PATENT DOCUMENTS

| | | | |
|---|---|---|---|
| 7,545,680 B2 * | 6/2009 | Kim et al. | 365/185.23 |
| 7,733,702 B2 * | 6/2010 | Hosono | 365/185.2 |
| 7,852,682 B2 * | 12/2010 | Byeon et al. | 365/185.23 |

FOREIGN PATENT DOCUMENTS

| | | |
|---|---|---|
| KR | 100612569 B1 | 8/2006 |
| KR | 1020080016537 A | 2/2008 |
| KR | 1020090000394 A | 7/2009 |
| KR | 1020100037277 A | 4/2010 |

\* cited by examiner

*Primary Examiner* — Son Dinh
(74) *Attorney, Agent, or Firm* — William Park & Associates Patent Ltd.

(57) ABSTRACT

A semiconductor memory device includes: a plurality of memory cells coupled in series between a bit line and a source line; and a bit line control voltage supply unit configured to provide a control voltage to the bit line according to an operation mode, wherein the bit line control voltage supply unit provides a control voltage having a ground voltage level to the bit line during a soft programming operation.

21 Claims, 4 Drawing Sheets

SEMICONDUCTOR MEMORY DEVICE AND DATA ERASE METHOD THEREOF

CROSS-REFERENCES TO RELATED APPLICATION

The present application claims priority under 35U.S.C. §119(a) to Korean application number 10-2011-0009809, filed on Jan. 31, 2011, in the Korean Intellectual Property Office, which is incorporated herein by reference in its entirety.

BACKGROUND

1. Technical Field

The present invention relates generally to a semiconductor memory device, and more particularly, to technology for performing a data erase operation.

2. Related Art

A known nonvolatile memory device such as a flash memory device includes a nonvolatile memory cell array comprising a plurality of nonvolatile memory cells. Each nonvolatile memory cell includes a transistor having a control gate and a floating gate.

Each of the nonvolatile memory cells may be a single-level cell (SLC) for storing one bit of data per cell. In other words, the single level cell (SLC) has two threshold voltage distributions. Furthermore, each of the nonvolatile memory cells may be a multi-level cell (MLC) for storing multiple bits of data per cell. In other words, the multi-level cell (MLC) can have three or more threshold voltage distributions (e.g., four threshold voltage distributions, eight threshold voltage distributions, etc.). Here, a threshold voltage distribution having the lowest level corresponds to an erased state. Here, the threshold voltage distribution has a Gaussian distribution shape.

If the threshold voltage distribution of the erased state is too wide because threshold voltages of some memory cells are too low, a large number of programming voltage pulses may need to be applied so as to program the memory cells having too low threshold voltages. Therefore, after an erase operation, a soft programming operation may be performed to form a threshold voltage distribution having a desired voltage level and shape.

In order to perform a soft programming operation, soft programming voltages are applied to word lines coupled to gates of the memory cells while applying ground voltages to channels of the memory cells. According to a known art, the ground voltage applied to the channel of the memory cell is supplied by a page buffer. The page buffer transmits the ground voltage to the channel of the memory cell through the bit line. Therefore, a time at which the ground voltage is supplied to the channel of the memory cell is delayed by a large loading value of the bit line. Furthermore, in order for the page buffer to provide the ground voltage, a large number of control signals should be used to control the page buffer.

SUMMARY

A semiconductor memory device capable of quickly providing a ground voltage to a memory cell during a soft programming operation is described herein.

Furthermore, a semiconductor memory device and a data erase method thereof, which are capable of quickly supplying a ground voltage to a memory cell during a soft programming operation and reducing a time required for performing a data erase operation, are described herein.

In an embodiment of the present invention, a semiconductor memory device includes: a plurality of memory cells coupled in series between a bit line and a source line; and a bit line control voltage supply unit configured to provide a control voltage to the bit line according to an operation mode, wherein the bit line control voltage supply unit provides a control voltage having a ground voltage level to the bit line during a soft programming operation.

In an embodiment of the present invention, there is provide a semiconductor memory device including a memory cell string having a first selection transistor, a plurality of memory cells, and a second selection transistor, which are coupled in series to each other. The memory cell string is coupled between a bit line adjacent to the first selection transistor and a source line adjacent to the second selection transistor, and during a soft programming operation, the first selection transistor is controlled to electrically float the memory cell string, the second selection transistor is controlled to couple the memory cell string and the source line, and a ground voltage is supplied through the source line.

In an embodiment of the present invention, there is provided a data erase method of a semiconductor memory device which includes a plurality of memory cells coupled in series between a bit line and a source line and a page buffer configured to control read, write, and erase operations for the plurality of memory cells. The data erase method including the steps of: performing an erase operation on the plurality of memory cells; and performing a soft programming operation on the plurality of memory cells by electrically isolating the bit line from the page buffer and then applying a control voltage having a ground voltage level to the bit line.

In an embodiment of the present invention, there is provided a data erase method of a semiconductor memory device which includes a plurality of memory cells coupled in series between a bit line and a source line. The data erase method including the steps of: performing an erase operation on a plurality of memory cells; and performing a soft programming operation on the plurality of memory cells by electrically isolating the bit line from the plurality of memory cells and then applying a ground voltage to the source line.

BRIEF DESCRIPTION OF THE DRAWINGS

Features, aspects, and embodiments are described in conjunction with the attached drawings, in which.

DETAILED DESCRIPTION

Hereinafter, a semiconductor memory device and a data erase method thereof according to the present invention will be described below with reference to the accompanying drawings through exemplary embodiments.

Figure 1:
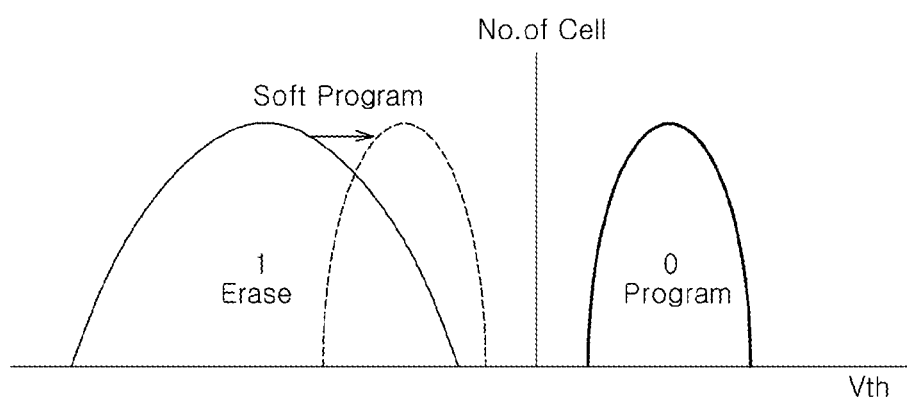
FIG. 1 is a diagram illustrating a threshold voltage distribution of a memory cell based on a soft programming operation.

FIG. 1 is a diagram illustrating a threshold voltage distribution of a memory cell based on a soft programming operation.

Referring to FIG. 1, when an erase operation is completed, a threshold voltage distribution may be formed at a lower level than a desired level. Therefore, after the erase operation, a soft programming operation is performed to form a threshold voltage distribution having a desired voltage level and shape. That is, the threshold voltage distribution shifts to a higher voltage level.

Figure 2:
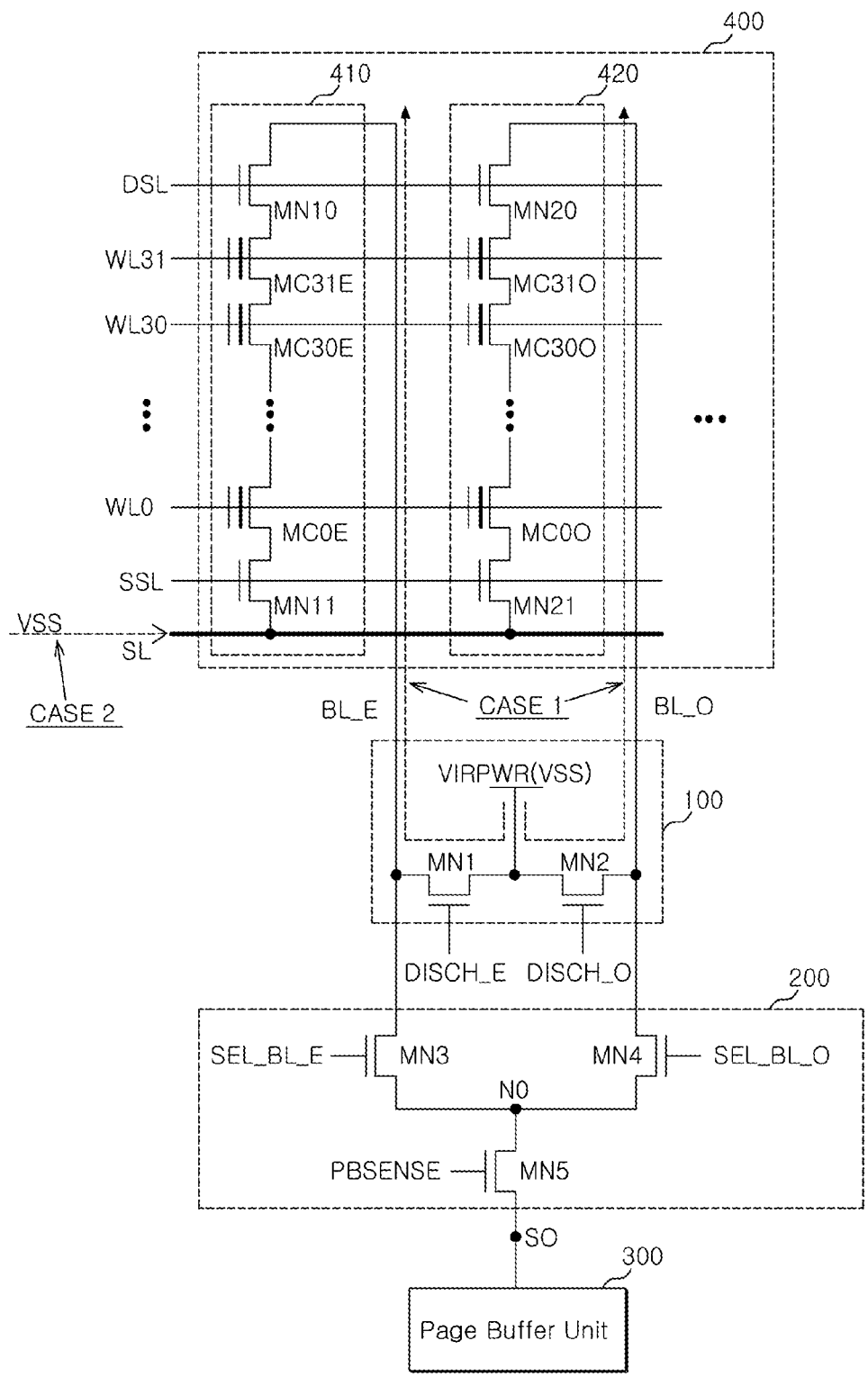
FIG. 2 is a configuration diagram of a semiconductor memory device according to one embodiment.

FIG. 2 is a configuration diagram of a semiconductor memory device according to an embodiment of the present invention.

The configuration diagram includes only simple components for clearly explaining the technical idea of the present invention.

Referring to FIG. 2, the semiconductor memory device includes a bit line control voltage supply unit 100, a data transmission unit 200, a page buffer unit 300, and a memory cell array 400. The memory cell array 400 includes a first memory string 410 and a second memory string 420. The configuration diagram includes limited numbers of word lines WL, memory cells, and bit lines, in order to clarify the descriptions.

The detailed configuration and main operation will be described as follows.

The memory cell array 400 may be divided into memory strings, pages, and memory blocks.

A plurality of memory cells coupled in series between a bit line BL and a source line SL form a memory string. FIG. 2 illustrates that a first memory string 410 and a second memory string 420 are provided. The first memory string 410 is coupled between a first bit line BL_E and a source line SL, and the second memory string 420 is coupled between a second bit line BL_0 and the source line SL.

A circuit related to a memory string, e.g., the first memory string 410 will be described in detail as follows. The first memory string 410 includes a plurality of memory cells MC0E to MC31E, a first selection transistor MN10, and a second selection transistor MN11. The first selection transistor Mn10 is arranged between the plurality of memory cells MC0E to MC31E and the first bit line BL_E. Furthermore, the second selection transistor MN11 is arranged between the plurality of memory cells MC0E to MC31E and the source line SL. Here, the first selection transistor NM10 is selectively turned on in response to a signal transmitted through a drain selection line DSL. Furthermore, the second selection transistor MN11 is selectively turned on in response to a signal transmitted through a source selection line SSL.

Furthermore, the plurality of memory cells MC0E to MC31E composing the first memory string 410 are coupled to a plurality of word lines WL0 to WL31 allocated thereto, respectively. Here, each of the word lines WL0 to WL31 is coupled to the respective memory cell of each memory string. Therefore, each of the word lines (e.g., WL0) is coupled to a plurality of memory cells (e.g., MC0E, MC0O, etc) and a plurality of memory cells coupled to a word line form a page.

Furthermore, memory cells coupled to the word lines WL0 to WL31 and memory strings (i.e., first string, second string, etc.) form a memory block.

The memory cell array 400 is formed by arranging a plurality of memory blocks. For reference, a programming operation is performed on a page basis (i.e., a page at a time), and an erase operation is performed on a block basis (i.e., a block at a time).

In an embodiment of the present invention, a memory cell includes a transistor having a control gate and a floating gate. When a programming voltage is applied to the control gate of the memory cell, tunneling occurs and charges are stored in the floating gate so as to perform a programming operation. Furthermore, when an erase voltage is applied to a bulk of the memory cell, tunneling occurs and charges are removed from the floating gate so as to perform an erase operation. For reference, the programming voltage is transmitted to the memory cell through a word line.

The bit line control voltage supply unit 100 is configured to supply control voltages VIRPWR having different levels to the first and second bit lines BL_E and BL_O, according to an operation mode. In an embodiment of the present invention, the bit line control voltage supply unit 100 includes NMOS transistors MN1 and MN2. The NMOS transistor MN1 is coupled between a control voltage terminal VIRPWR and the first bit line BL_E and controlled according to a first control signal DISCH_E. The NMOS transistor MN2 is coupled between the control voltage terminal VIRPWR and the second bit line BL_O, and controlled according to a second control signal DISCH_O.

During a programming operation, the bit line control voltage supply unit 100 supplies a control voltage VIRPWR having a higher level than a ground voltage VSS to program-inhibited memory strings so that corresponding memory cells are not programmed.

During a soft programming operation, according to an embodiment of the present invention, the bit line control voltage supply unit 100 may supply a control voltage VIRPWR having a ground voltage level to the first and second bit lines BL_E and BL_O. Here, the data transmission unit 200 may electrically isolate the bit lines BL_E and BL_O from the page buffer unit 300. Such an operation is illustrated in a first example CASE1.

Since the first selection transistors MN10 and MN20 are turned on when the ground voltage VSS is supplied to the first and second bit lines BL_E and BL_O, the ground voltage VSS is supplied to the channels of the plurality of memory cells MC0E to MC31E and MC0O to MC31O. Next, the second selection transistors MN11 and MN21 are turned off, the plurality of memory cells MC0E to MC31E and MC0O to MC31O and the source line SL are electrically disconnected. Furthermore, as a soft programming voltage is applied to the plurality of word lines WL0 to WL31 coupled to the respective memory cells MC0E to MC31E and MC0O to MC031, the threshold voltage distribution of the memory cells MC0E to MC31E and MC0O to MC31O is controlled. That is, the threshold voltage distribution moves to a higher voltage level and become narrowed.

In an embodiment of the present invention, the semiconductor memory device may be configured to supply the ground voltage VSS to the bit lines BL_E and BL_O through the source line SL without supplying the ground voltage VSS through the bit line control voltage supply unit 100, during the soft programming operation. Such an operation is illustrated in a second example CASE2.

When the soft programming operation is performed, the first selection transistors MN10 and MN20 are turned off, and thus the plurality of memory cells MC0E to MC31E and MC0O to MC31O and the bit lines BL_E and BL_O are electrically disconnected. Next, the second selection transistors MN11 and MN21 are turned on, and thus the plurality of memory cells MC0E to MC31E and MC0O to MC31O and the source line SL are electrically connected. Therefore, the ground voltage VSS of the source line SL is supplied to the channels of the memory cells MC0E to MC31E and MC0O to MC31O. Furthermore, as the soft programming voltage is applied to the plurality of word lines WL0 to WL31 coupled to the respective memory cells MC0E to MC31E and MC0O to MC31O, the threshold voltage distribution of the memory cells MC0E to MC31E and MC0O to MC31O is controlled. That is, the threshold voltage distribution moves to a higher level and become narrowed.

When the ground voltage VSS is supplied to the channels of the plurality of memory cells MC0E to MC31E and MC0O to MC31O through the method as illustrated in the first example CASE1 and the soft programming voltage is applied to the plurality of word lines WL0 to WL31 so as to perform the soft programming operation, the page buffer unit 300 does not need to be controlled in a complex manner. Furthermore, since the ground voltage VSS of the control voltage terminal VIRPWR is immediately supplied to the bit lines BL_E and BL_O, the ground voltage VSS is more quickly transmitted to the channels of the memory cells.

Furthermore, if the ground voltage VSS is supplied to the channels of the plurality of memory cells MC0E to MC31E and MC0O to MC31O through the method as illustrated in the second example CASE2 and the soft programming voltage is applied to the plurality of word lines WL0 to WL31 to perform the soft programming operation, the page buffer unit 310 does not need to be controlled in a complex manner. Furthermore, since the ground voltage VSS is supplied to the channels of the memory cells through the source line SL, the ground voltage VSS is more quickly transmitted to the channels of the memory cells, regardless of the loading value of a bit line BL.

The data transmission unit 200 selectively performs data transmission between the bit lines BL_E and BL_O and the page buffer unit 300. In an embodiment of the present invention, the data transmission unit 200 includes NMOS transistors MN3, MN4, and MN5. The NMOS transistor MN3 is coupled between the first bit line BL_E and a first node N0 and controlled according to a first bit line selection signal SEL_BL_E. The NMOS transistor MN4 is coupled between the second bit line BL_O and the first node NO and controlled according to a second bit line selection signal SEL_BL_O. The NMOS transistor MN5 is coupled between the first node N0 and the page buffer unit 300 and controlled according to a sensing signal PMSENSE.

The page buffer unit 300 senses and amplifies read data received through the bit lines BL_E and BL_O, or transmits write data to the bit lines BL_E and BL_O.

Figure 3:
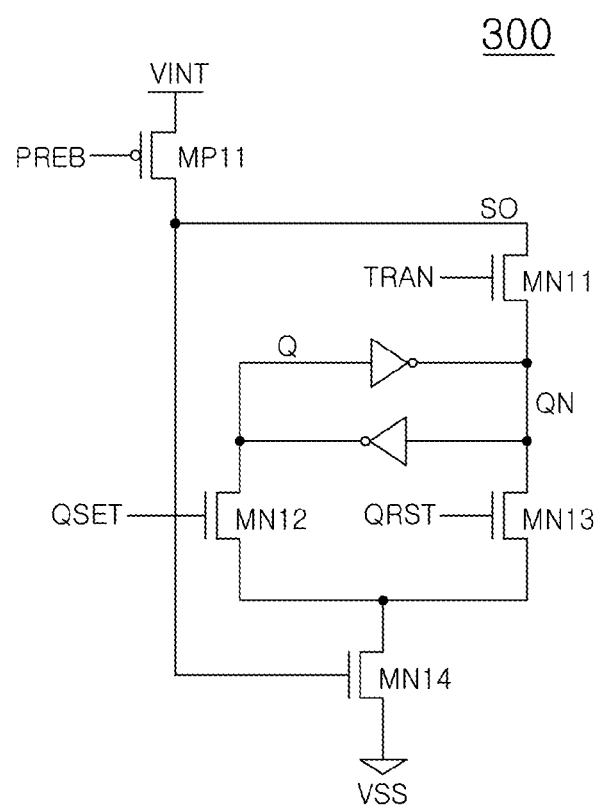
FIG. 3 is a circuit diagram of a page buffer unit illustrated in FIG. 2.

FIG. 3 is a circuit diagram of the page buffer unit illustrated in FIG. 2.

Referring to FIG. 3, the page buffer unit 300 senses and amplifies read data received through the bit lines BL_E and BL_O by controlling signals such as a precharge signal PREB, a transmitted signal TRAN, a set signal QSET, and a reset signal QRST, or transmits write data to the bit lines BL_E and BL_O.

Figure 4:
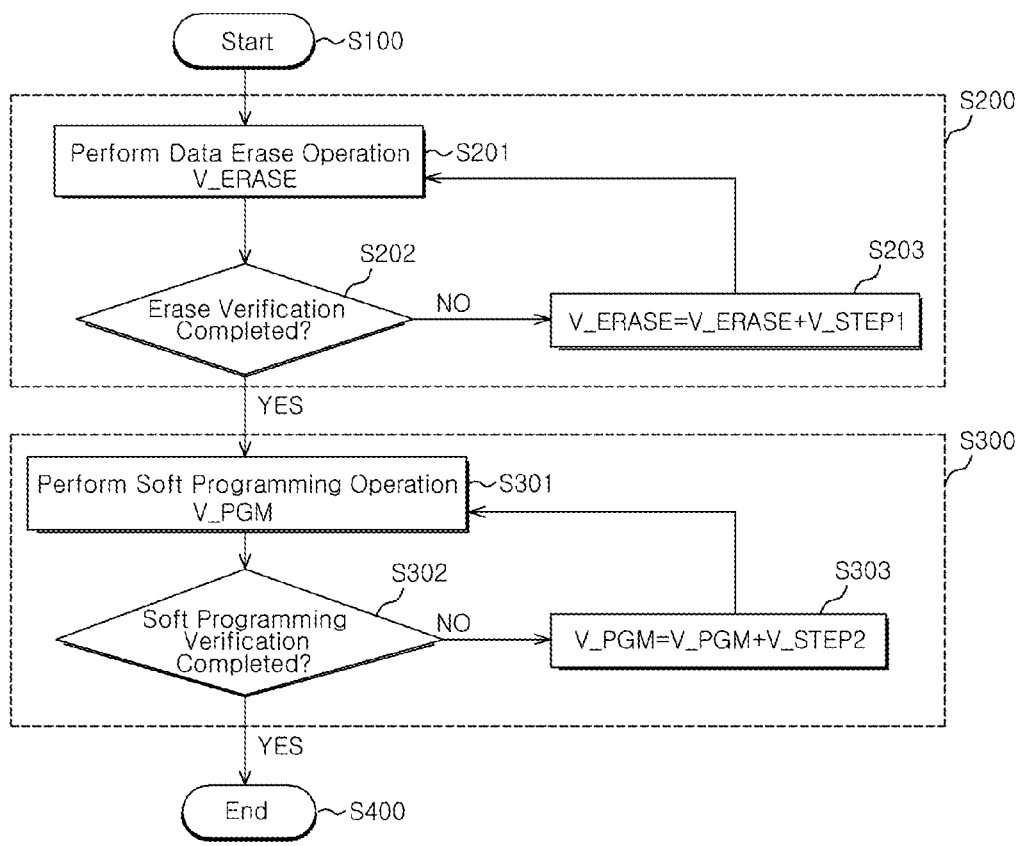
FIG. 4 is a flow chart showing a data erase method of the semiconductor memory device according to an embodiment of the present invention.

FIG. 4 is a flow chart showing a data erase method of the semiconductor memory device according to an embodiment of the present invention.

Referring to FIG. 4, the data erase method of the semiconductor memory device will be described as follows.

In an embodiment of the present invention, a data erase method, as illustrated in the first example CASE1, includes the steps of: performing an erase operation on a plurality of memory cells at step S200; and performing a soft programming operation on the plurality of memory cells by applying a control voltage having a ground voltage level to the bit line at step S300 while electrically disconnecting a bit line from a page buffer unit and applying a soft programming voltage to a plurality of word lines coupled to the plurality of memory cells.

The step S200 of performing the erase operation includes the steps of: electrically disconnecting the plurality of memory cells from the source line and the bit line and applying an erase voltage V_ERASE to the plurality of memory cells (e.g., the bulk of the memory cells) at step S201; verifying whether the threshold voltage distribution of the plurality of memory cells has reached a target level or not at step S202; and if the threshold voltage distribution of the plurality of memory cells has not reached the target level, increasing the erase voltage V_ERASE by a predetermined level and applying the increased erase voltage V_ERASE at step S203.

Furthermore, the step S300 of performing the soft programming operation includes the steps of: applying a ground voltage from a bit line control voltage supply unit, electrically disconnecting the plurality of memory cells from the source line and applying a soft programming voltage V_PGM to the plurality of word lines coupled to the respective memory cells at step S301; verifying whether the threshold voltage distribution of the plurality of memory cells has reached a target level or not at step S302; and if the threshold voltage distribution of the plurality of memory cells has not reached a target level, increasing the soft programming voltage V_PGM by a predetermined level and applying the increased soft programming voltage V_PGM to the plurality of word lines at step S303.

In an embodiment of the present invention, a data erase method, as illustrated in the second example CASE2, includes the steps of: performing an erase operation on a plurality of memory cells at step S200; and performing a soft programming operation on the plurality of memory cells by applying a ground voltage to a source line at step S300 while electrically disconnecting a bit line from the plurality of memory cells.

The step S200 of performing the erase operation on the plurality of memory cells includes the steps of: electrically disconnecting the plurality of memory cells from the source line and the bit line and applying an erase voltage V_ERASE to the plurality of memory cells (e.g., the bulk of the memory cells) at step S201; verifying whether the threshold voltage distribution of the plurality of memory cells has reached a target level at step S202; and if the threshold voltage distribution of the plurality of memory cells has not reached the target level, increasing the erase voltage V_ERASE by a predetermined level and applying the increased erase voltage V_ERASE at step S203.

The step S300 of performing the soft programming operation on the plurality of memory cells includes the steps of: applying a ground voltage to the channels of the plurality of memory cells from a source line and applying a soft programming voltage V_PGM to a plurality of word lines coupled to the respective memory cells at step S301; verifying whether the threshold voltage distribution of the plurality of memory cells has reached a target level or not at step S302; and when the threshold voltage distribution of the plurality of memory cells has not reached the target level, increasing the programming voltage V_PGM by a predetermined level and applying the increased programming voltage V_PGM to the plurality of word lines at step S303.

As described above, the semiconductor memory device according to various embodiments may quickly supply the ground voltage to the memory cells during the soft programming operation. Furthermore, the semiconductor memory device according to various embodiments of the present invention may reduce the time required for performing the data erase operation, because the ground voltage is quickly supplied to the memory cells during the soft programming operation.

While certain embodiments have been described above, it will be understood to those skilled in the art that the embodiments described are by way of example only. Accordingly, the semiconductor memory device and the data erase method described herein should not be limited based on the described embodiments. Rather, the semiconductor memory device and the data erase method described herein should only be limited in light of the claims that follow when taken in conjunction with the above description and accompanying drawings.

What is claimed is:

1. A semiconductor memory device comprising:
a plurality of memory cells coupled in series between a bit line and a source line;
a page buffer unit configured to sense and amplify data of a memory cell selected from the plurality of memory cells through the bit line, or provide data, which is to be programmed into the memory cell selected from the memory cells, through the bit line;
a bit line control voltage supply unit configured to provide a control voltage having a ground voltage level to the bit line during a soft programming operation; and
a data transmission unit configured to electrically disconnect the bit line from the page buffer unit during the soft programming operation.

2. The semiconductor memory device according to claim 1, wherein the data transmission unit selectively performs data transmission between the bit line and the page buffer unit.

3. The semiconductor memory device according to claim 1, wherein each of the memory cells comprises a transistor having a control gate and a floating gate.

4. The semiconductor memory device according to claim 1, wherein the bit line control voltage supply unit comprises a transistor coupled between a control voltage terminal and the bit line and configured to control the coupling between the control voltage terminal and the bit line in response to a control signal.

5. The semiconductor memory device according to claim 1, wherein, during the soft programming operation, the plurality of memory cells and the source line are electrically disconnected from each other.

6. The semiconductor memory device according to claim 1, wherein, during the soft programming operation, a soft programming voltage is applied to a plurality of word lines coupled to the respective memory cells.

7. A semiconductor memory device comprising a memory cell string having a first selection transistor, a plurality of memory cells, and a second selection transistor, which are coupled in series to each other,
wherein the memory cell string is coupled between a bit line adjacent to the first selection transistor and a source line adjacent to the second selection transistor, and
during a soft programming operation, the first selection transistor is controlled to electrically disconnect the memory cell string from the bit line, the second selection transistor is controlled to couple the memory cell string to the source line, and a ground voltage is supplied through the source line.

8. The semiconductor memory device according to claim 7, further comprising:
a bit line control voltage supply unit configured to supply a control voltage to the bit line according to an operation mode;
a page buffer unit configured to sense and amplify data of a memory cell selected from the plurality of memory cells through the bit line or provide data, which is to be programmed into the memory cell selected from the plurality of memory cells, through the bit line; and
a data transmission unit configured to selectively perform data transmission between the bit line and the page buffer unit.

9. The semiconductor memory device according to claim 7, wherein each of the memory cells comprises a transistor having a control gate and a floating gate.

10. The semiconductor memory device according to claim 7, wherein the bit line control voltage supply unit comprises a transistor coupled between a control voltage terminal and the bit line and configured to control the coupling between the control voltage terminal and the bit line in response to a control signal.

11. The semiconductor memory device according to claim 7, wherein, during the soft programming operation, a soft programming voltage is applied to a plurality of word lines coupled to the respective memory cells.

12. A data erase method of a semiconductor memory device which includes a plurality of memory cells coupled in series between a bit line and a source line and a page buffer configured to control read, write, and erase operations for the plurality of memory cells, the data erase method comprising the steps of:
performing an erase operation on the plurality of memory cells; and
performing a soft programming operation on the plurality of memory cells by applying a control voltage having a ground voltage level to the bit line while electrically disconnecting the bit line from the page buffer.

13. The data erase method according to claim 12, wherein the step of performing the soft programming operation comprises the steps of:
electrically disconnecting the plurality of memory cells from the source line and then applying a soft programming voltage to a plurality of word lines coupled to the respective memory cells; and
verifying whether a threshold voltage distribution of the plurality of memory cells has reached a target level or not.

14. The data erase method according to claim 13, wherein the step of performing the soft programming operation further comprises the step of increasing the soft programming voltage by a predetermined level and applying the increased soft programming voltage to the plurality of word lines, when the threshold voltage distribution of the plurality of memory cells has not reached the target level.

15. The data erase method according to claim 12, wherein the step of performing the erase operation comprises:
electrically disconnecting the plurality of memory cells from the source line and the bit line, and then applying an erase voltage to the plurality of memory cells; and
verifying whether a threshold voltage distribution of the plurality of memory cells has reached a target level or not.

16. The data erase method according to claim 15, wherein the step of performing the erase operation further comprises the step of increasing the erase voltage by a predetermined level and applying the increased erase voltage, when the threshold voltage distribution of the plurality of memory cells has not reached the target level.

17. A data erase method of a semiconductor memory device which includes a plurality of memory cells coupled in series between a bit line and a source line, the data erase method comprising the steps of:
performing an erase operation on a plurality of memory cells; and
performing a soft programming operation on the plurality of memory cells by applying a ground voltage to the source line while electrically disconnecting the bit line from the plurality of memory cells.

18. The data erase method according to claim 17, wherein the step of performing the soft programming operation comprises the steps of:
- applying a soft programming voltage to a plurality of word lines coupled to the respective memory cells; and
- verifying whether a threshold voltage distribution of the plurality of memory cells has reached a target level or not.

19. The data erase method according to claim 18, wherein the step of performing the soft programming operation further comprises the step of increasing the soft programming voltage by a predetermined level and applying the increased soft programming voltage to the plurality of word lines, when the threshold voltage distribution of the plurality of memory cells has not reached the target level.

20. The data erase method according to claim 17, wherein the step of performing the erase operation comprises:
- electrically disconnecting the plurality of memory cells from the source line and the bit line and then applying an erase voltage to the plurality of memory cells; and
- verifying whether a threshold voltage distribution of the plurality of memory cells has reached a target level or not.

21. The data erase method according to claim 20, wherein the step of performing the erase operation further comprises the step of increasing the erase voltage by a predetermined level and applying the increased erase voltage, when the threshold voltage distribution of the plurality of memory cells has not reached the target level.

* * * * *